United States Patent [19]
Mori et al.

[11] Patent Number: 5,459,655
[45] Date of Patent: Oct. 17, 1995

[54] NEUTRAL-POINT CLAMPED INVERTER DEVICE USING SEMICONDUCTOR MODULES

[75] Inventors: Mutsuhiro Mori; Ryuichi Saito; Shin Kimura, all of Hitachi; Kiyoshi Nakata, Ibaraki; Syuuji Saitoo; Akira Horie, both of Katsuta; Yoshihiko Koike; Shigeki Sekine, both of Hitachi, all of Japan

[73] Assignee: Hitachi, Ltd., Tokyo, Japan

[21] Appl. No.: 947,544

[22] Filed: Sep. 21, 1992

[30] Foreign Application Priority Data

Sep. 20, 1991 [JP] Japan .................................. 3-241681
Jan. 29, 1992 [JP] Japan .................................. 4-013684

[51] Int. Cl.⁶ .............................................. H02M 7/5387
[52] U.S. Cl. ........................................ 363/132; 363/43
[58] Field of Search .............................. 363/43, 98, 132; H02M 7/48, 7/5837

[56] References Cited

U.S. PATENT DOCUMENTS

| | | | |
|---|---|---|---|
| 4,670,833 | 6/1987 | Sachs | 363/132 |
| 4,816,984 | 3/1989 | Porst et al. | 363/56 |
| 4,907,068 | 3/1990 | Amann | 357/74 |
| 4,965,710 | 10/1990 | Pelly et al. | 363/56 |
| 5,025,360 | 6/1991 | Latos | 363/16 |
| 5,038,194 | 8/1991 | Takahama | 357/68 |
| 5,055,990 | 10/1991 | Miki et al. | 363/56 |
| 5,119,286 | 6/1992 | Huss et al. | 363/147 |
| 5,155,675 | 10/1992 | Maruyama et al. | 363/98 |
| 5,170,337 | 12/1992 | Borowiec | 363/147 |
| 5,182,626 | 1/1993 | Akiyama et al. | 257/142 |
| 5,184,291 | 2/1993 | Crowe et al. | 363/37 |

FOREIGN PATENT DOCUMENTS

| | | | |
|---|---|---|---|
| 0277546 | 1/1988 | European Pat. Off. | H01L 25/04 |
| 3516995 | 5/1985 | Germany | H01L 23/48 |
| 3907940 | 3/1989 | Germany | H02M 7/48 |
| 58-187023 | 11/1983 | Japan | 363/132 |
| 62-40069 | 2/1987 | Japan | H02M 7/48 |
| 1-160373 | 6/1989 | Japan | H02M 7/48 |
| 4-322174 | 11/1992 | Japan | H02M 7/48 |

OTHER PUBLICATIONS

20th IEEE Power Electronics Specialists Conference Record, Jun. 26, 1989, M. Marchesoni: "High Performance Current Control Techniques for Applications to Multilever High Power Voltage Source Inverters", pp. 672–682.
27th Railway Cybernetics Application Symposium; Jan. 1990; pp. 198–202.

*Primary Examiner*—Jeffrey L. Sterrett
*Attorney, Agent, or Firm*—Antonelli, Terry, Stout & Kraus

[57] ABSTRACT

An inverter device includes plural modules, each module being formed by a series circuit having a parallel circuit of a first switching device and a first diode, and a parallel circuit of a second switching device and a second diode, allowing a reduced size, high reliability, high frequency switching and low noise. Each module forms one arm portion of the inverter. Lifetimes of the diodes and the switching devices are set in a manner to equalize losses in the inverter. Preferably, insulated gate bipolar transistors (IGBTs) formed by diffusion are used as the switching devices since the lifetimes of these devices can easily be adjusted to optimize design of the inverter.

5 Claims, 15 Drawing Sheets

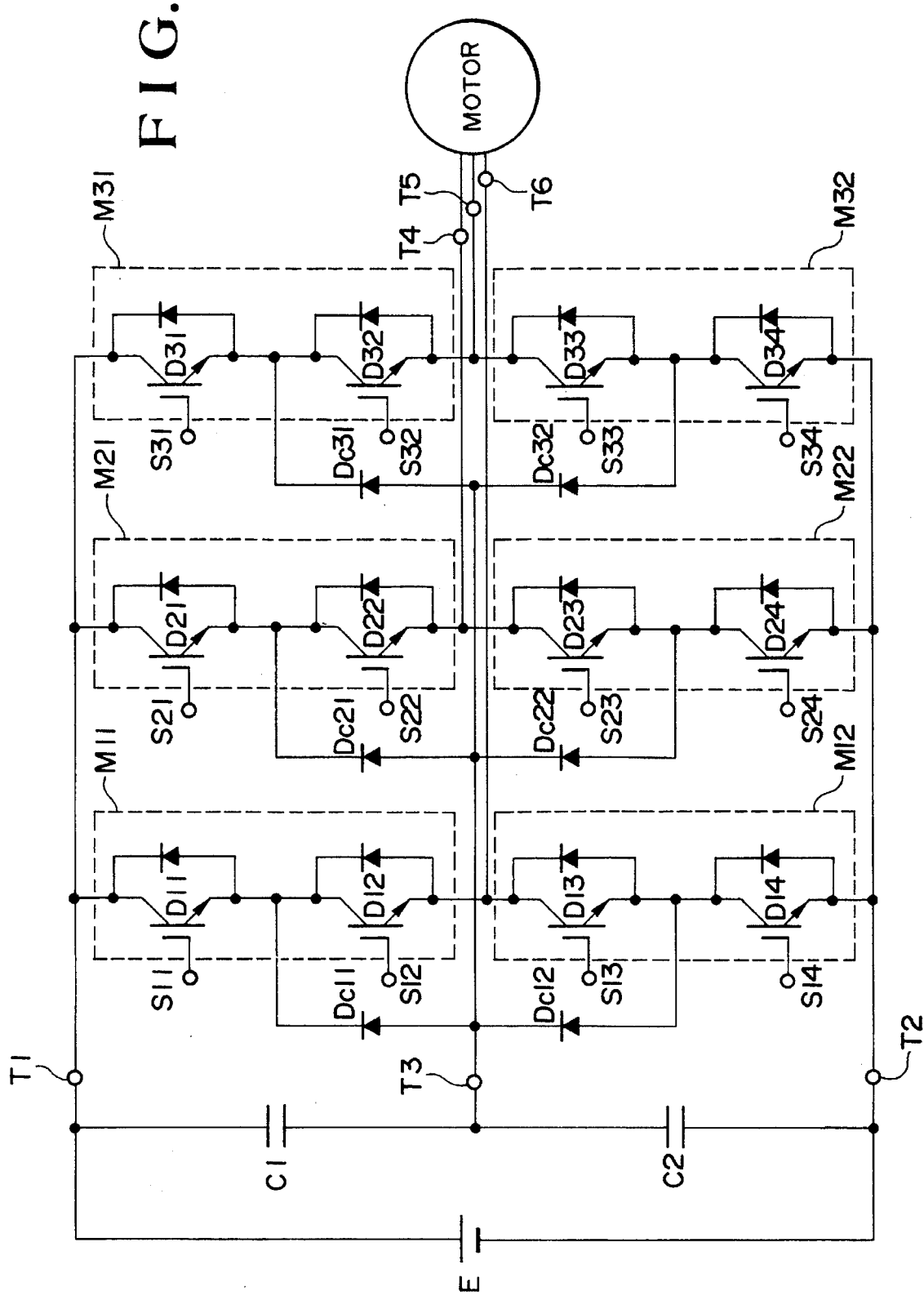

FIG.6A  FIG.6B
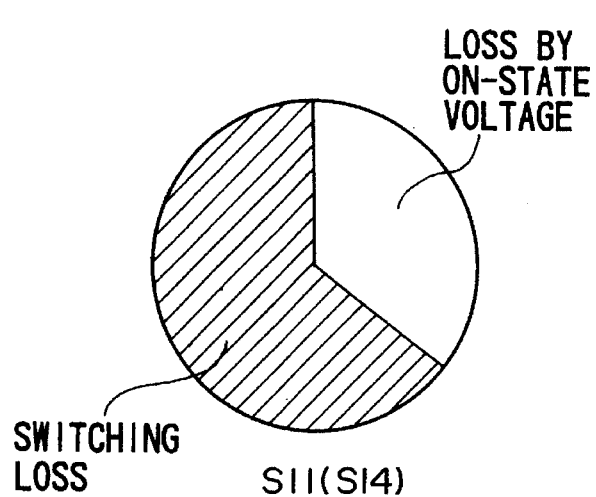
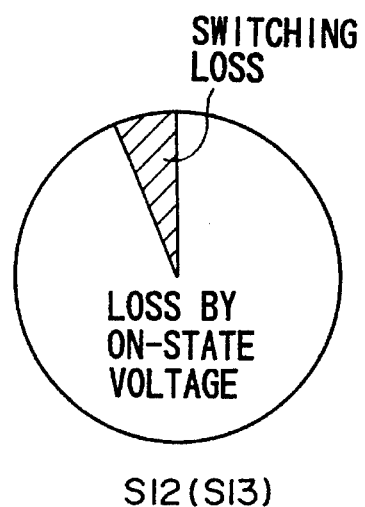
FIG.7A  FIG.7B  FIG.7C
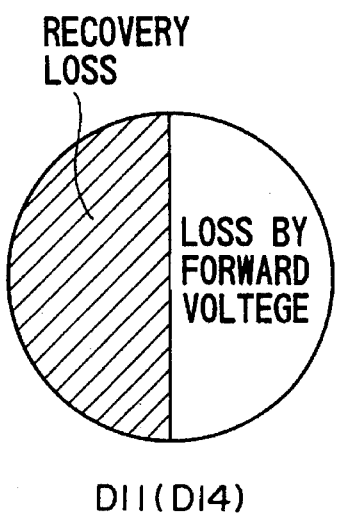
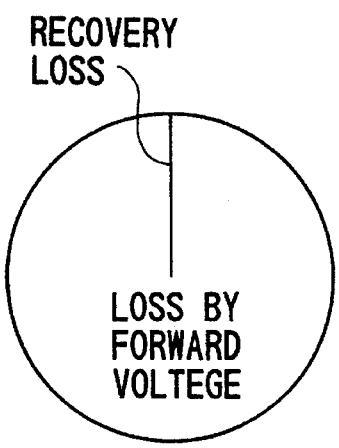
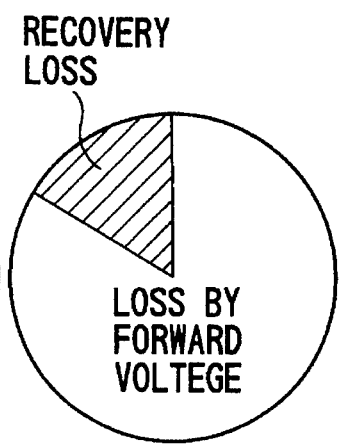

NEUTRAL-POINT CLAMPED INVERTER DEVICE USING SEMICONDUCTOR MODULES

BACKGROUND OF THE INVENTION

This invention relates to a power conversion device and a semiconductor module suited for reduction of power loss caused by noise, size reduction, high-frequency switching, lower noise, and improved reliability of a three-level inverter device.

In a drive control unit for a motor for vehicles, an inverter device is used which can change the frequency of the power supply in order to control the number of revolutions of an a.c. motor. It has been hitherto common that a minimum unit of the inverter device is composed of two switching devices connected in series, which are turned on and off alternately. Instead of the two-level inverter device, attention has recently been focused on a three-level inverter device (also called a neutral-point clamping voltage type inverter), a minimum unit of which comprises four switching devices connected in series (27th Railway Cybernetics Application Symposium, 1990, pp. 198–202). One reason for this is that an output voltage waveform of the three-level inverter device has an intermediate potential point out of a high potential point P and a low potential point N to thereby have a smoothly stepping three-level operation. This has advantages in that low-order harmonics, torque pulsation and noise level can be reduced, in comparison with the conventional two-level inverter devices only having a high potential point P and a low potential point N.

However, compared with the two-level inverter device, the three-level inverter device additionally requires twice as many switching devices and clamping diodes equal to the number of arms of the inverter device. Thus, the three-level inverter device becomes larger in size. Also this increases heat loss in the devices, which causes a problem. The increase of the heat loss requires a large-size cooling apparatus, and, as a result, a system in which the inverter device is used becomes large, which causes another problem. These problems have obstructed the widespread use of the three-level inverter devices.

In addition to the above problems, in case of the three-level inverter device, the use of many devices means that the length of wiring is longer, the wiring inductance is greater, and voltage noise is large, the voltage noise being generated by the wiring inductance and a current change di/dt at the time of switching the switching devices, so that increasing the dielectric strength of the switching devices has found to be necessary by the present inventors. However, increasing the dielectric strength of the switching devices decreases the output current density of the devices, with the result that devices having a larger chip area are required. Therefore, efforts toward the size reduction of the inverter device cannot be achieved.

SUMMARY OF THE INVENTION

It is therefore an object of the present invention to provide a power conversion device and a semiconductor module suitable for use in the device which has solved the above-mentioned problems.

Another object of the present invention is to provide a power conversion device and a semiconductor module suitable for use in the device featuring reduced size, high frequency switching, low noise, and high reliability.

According to an aspect of the inverter device of the present invention, the inverter device comprises: a pair of d.c. terminals; a node having an intermediate potential between the potential of the pair of d.c. terminals; a.c. terminals equal to the number of phases of a.c. output; a plurality of arms connected between each d.c. terminal and each a.c. terminal, and comprising two parallel circuits connected in series with a switching device and a diode of opposite polarity to the switching device; and diodes connected between the two parallel circuits of each arm, and the node having an intermediate potential between the potential of the pair of the d.c. terminals, wherein each arm is comprised of a single module.

According to another aspect of the inverter device of the present invention, there is a point that the lifetime of one of the switching device and diode on the d.c. terminal side are made different from that of one of the switching device and the diode on the a.c. terminal side. More specifically, the lifetime of the diode on the d.c. terminal side is made shorter than that of the diode on the a.c terminal side. In the case of an inverter device having a regenerative mode, the lifetime of the switching device on d.c. terminal side is made substantially equal to that of the switching device on the a.c. terminal side. On the other hand, in the case of an inverter device without a regenerative mode, the lifetime of the switching device on the d.c. terminal side is made shorter than that of the switching device on the a.c. terminal side.

The switching device can be an insulated gate bipolar transistor (IGBT), a bipolar transistor, a power MOS transistor, a gate turn-off thyristor or an electrostatic induction thyristor, for example, but an IGBT is the most desirable.

In another aspect of a semiconductor module according to the present invention, the module comprises: a metal substrate; a plurality of switching device chips each having a pair of principal surfaces, one main electrode disposed on one principal surface and another main electrode and a control electrode disposed on the other principal surface, and disposed on the metal substrate through a buffer plate having a thermal expansion coefficient close to that of a semiconductor; at least a diode chip having a pair of principal surfaces, one main electrode being disposed on one principal surface and the other main electrode being disposed on the other principal surface, and disposed on the metal substrate through a buffer plate having a thermal expansion coefficient close to that of a semiconductor; a first electrode plate disposed on the metal substrate through an insulating plate, and extending along all switching device chips and diode chips; a second electrode plate disposed on the metal substrate through an insulating plate, separated from the first electrode plate, and extending along all switching device chips; a first connecting conductor connecting the other main electrode of the switching device chip and diode with the first electrode plate; a second connecting conductor connecting the control electrode of the switching device chip with the second electrode plate; a first extension terminal disposed on the metal substrate and extending in a direction substantially at a right angle to the metal substrate; a second extension terminal extending in a direction substantially at a right angle to the first electrode plate disposed on a portion close to the diode chip on the first electrode plate; and a third extension terminal extending in a direction substantially at a right angle to the metal substrate disposed on the second electrode plate.

BRIEF DESCRIPTION OF THE DRAWINGS

FIG. 1 is a circuit diagram showing an embodiment of a three-level inverter device of the present invention;

FIGS. 6A and 6B are circular graphs showing losses of the IGBT in the three-level inverter device;

FIGS. 7A, 7B and 7C are circular graphs showing losses of the diode in the three-level inverter device;

DESCRIPTION OF THE PREFERRED EMBODIMENTS

Figure 2A:
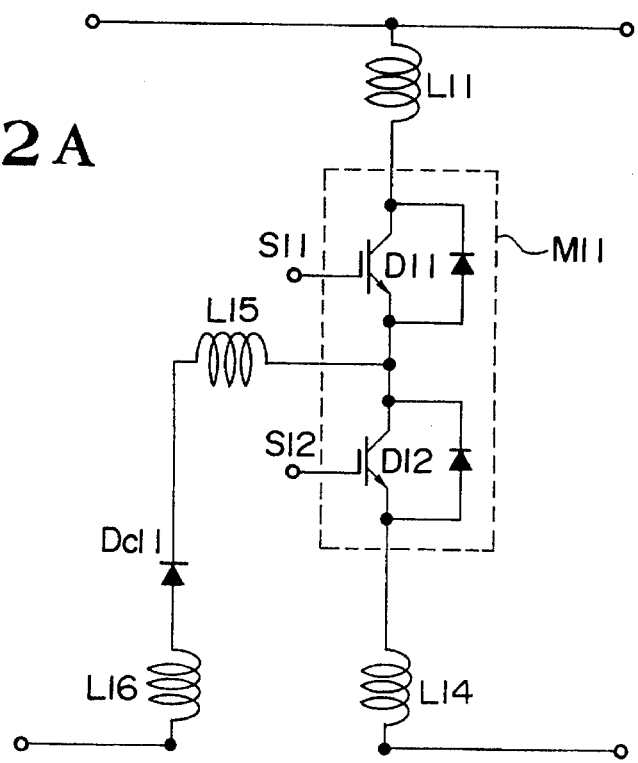
FIGS. 2A and 2B are schematic circuits diagram for explaining the operation and effect of the three-level inverter device in FIG. 1.

Embodiments of the present invention will now described with reference to the accompanying drawings.

FIG. 1 is a circuit diagram showing an embodiment of an inverter device according to the present invention. In FIG. 1, reference code E denotes a d.c. power source, T1 and T2 denote first and second d.c. terminals connected respectively to a high potential side and a low potential side of the d.c. power source E, C1 and C2 denote capacitors, connected in series between the first and second terminals, for providing a third d.c. terminal T3 at an intermediate potential between the potentials of the first and second d.c. terminals, and T4, T5 and T6 denote a.c. terminals each end of which is connected to a motor. In between the first and second d.c. terminals, a series circuit including switching devices S11, S12, S13 and S14, a series circuit including switching devices S21, S22, S23 and S24, and a series circuit including switching devices S31, S32, S33 and S34 are connected therebetween. Diodes D11, D12, D13, D14, D21, D22, D23, D24, D31, D32, D33 and D34 are connected with each switching device so that these diodes are opposite in conducting direction to the conducting direction of the switching devices. The mid-nodes of the respective series circuits of the switching devices are connected to the other ends of the a.c terminals T4, T5 and T6. Three pairs of clamping diodes Dc11 and Dc12, Dc21 and Dc22, and Dc31 and Dc32 respectively connecting in series, are connected respectively between the node of the switching devices S11, S12 and the node of the switching devices S13, S14, between the node of the switching devices S21, S22 and the node of the switching devices S23, S24, and between the node of the switching devices S31, S32 and the node of the switching devices S33, S34 so that their conducting directions are opposite to the conducting directions of the switching devices. Each node of the clamping diodes is connected with the third d.c. terminal T3. In this embodiment, as indicated by dotted lines, the switching devices S11 and S12 respectively connected in parallel with the diodes D11 and D12 in the opposite conductive direction are comprised of a single module M11, the switching devices 13 and 14 respectively connected in parallel with the diodes D13 and D14 in the opposite conductive direction are comprised of a single module M12. Similarly, the switching devices S21 and S22 respectively connected in parallel with the diodes D21 and D22 in the opposite conductive direction are comprised of a module M21, the switching devices S23 and S24 respectively connected in parallel with the diodes D23 and D24 are comprised of a module M22, the switching devices S31 and S32 respectively connected in parallel with the diodes D31 and D32 are comprised of a module M31, and the switching devices S33 and S34 respectively connected in parallel with the diodes D33 are comprised of a module M32.

In this embodiment, IGBTs are used for the switching devices. Instead of the IGBTs, it is possible to use bipolar transistors, power MOS transistors, gate turn-off thyristors, or static induction thyristors.

Figure 2B:
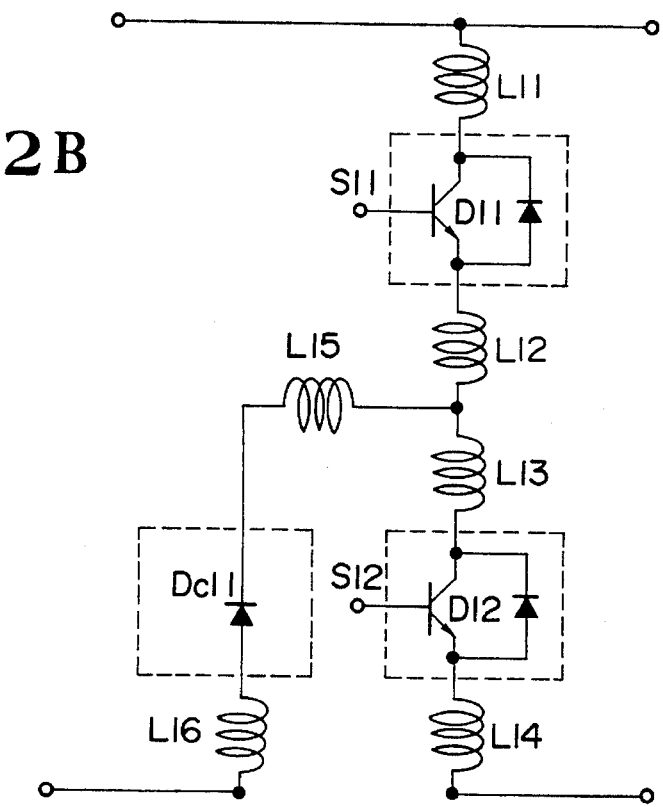

By using a three-level inverter device thus structured, the following effects can be expected. In the first place, by respectively connecting the first and second diodes D11 and D12 to the first and second switching devices S11 and S12 in parallel with the opposite conductive direction, in other words, by having the single module M11 comprising one of the arm portions of the inverter device, the wiring length can be short, providing small inductance. This will be described with reference to FIGS. 2A and 2B. FIGS. 2A and 2B show circuit diagrams in which FIG. 2A shows that the single module M11 comprises the diodes D11 and D12 respectively connected in parallel with the switching devices S11 and S12 in the opposite conductive direction, while FIG. 2B shows the situation of these same respective devices connected to each other without the module of the present invention. Reference numerals L11, L12, L13, L14, L15 and L16 denote wiring inductances. As is clear from comparing the two cases, by forming the circuit into a module, the inductances L12 and L13 present between the parallel circuit having the switching device S11 and the diode D11, and the parallel circuit having the switching device S12 and the diode D12 are, very small (less than one-tenth). Decreasing the wiring inductance offers three following advantages. The first advantage is that voltage variation (less than one-tenth) caused by a current change di/dt in switching and inductance can be small, the dielectric strength of the switching device and the diode can be decreased, the output current density of the switching device and the diode can be increased (more than 30%), so that the inverter device can be achieved with smaller size. Since an inverter device used for a vehicle is installed under the floor thereof, its installation area is limited. However, the three-level inverter device of the present invention can be formed with a very small size in accordance with the first advantage described above, and can also be reduced in weight and power consumption. The second advantage is that the switching speed of the switching devices is at a high frequency, thereby eliminating the low portion of the audio frequency and achieving noise reduction. Noise is an especially vexing problem in case of the underground, suburban and rapid-transit railways. However, by increasing di/dt, the switching operation can be at a high frequency, so that the noise produced by the running train can be remarkably reduced. The third advantage is that voltage noise is decreased, so that firing error of the switching device can be eliminated. This helps achieve high reliability for the switching operation. This advantage is particularly effective for inverter devices used for trains of the public transportation system for obtaining reliability and safety.

When IGBTs are used for the switching device, the following additional advantage can be obtained. That is, in the case of a three-level inverter device, since the switching devices S11, S12, S13 and S14 have different potential for each, it is to use a high voltage insulated transformer in case of using the trolley voltage of 1500 volts or more for use in the train. If a current-driven type device is used for the switching device, because it is necessary to supply a large amount of control power, a disadvantage occurs in that the control circuit is complicated. However, by using an IGBT controlled by a voltage of a small electric power, the power is readily supplied with different potentials, making the inverter device small. Of course, power MOS transistors are known besides the IGBTs as voltage-controlled device. However, in the application where the trolley voltage of 1500 volt is used for a vehicle, the power loss is incurred of several 10 times greater than that in an IGBT, so that the size reduction cannot be achieved.

Figure 3A:
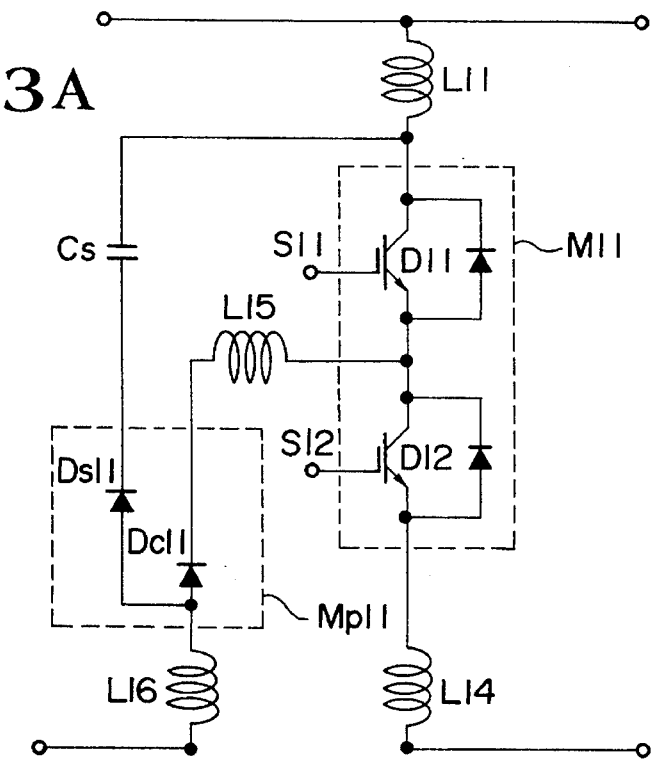
FIGS. 3A and 3B are schematic circuits diagram showing a modification of the three-level inverter device in FIG. 1.
Figure 3B:
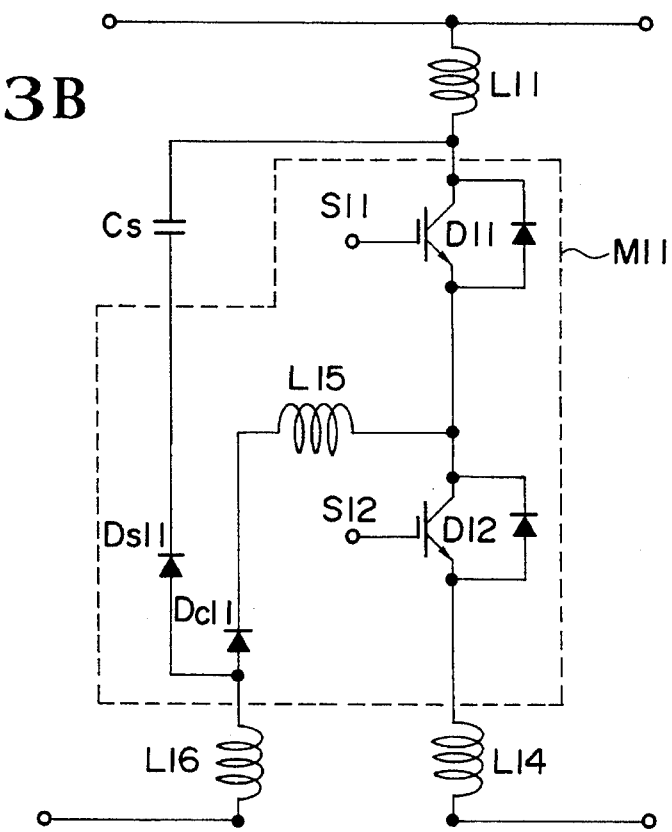

The embodiment can be modified as described in the following. A first modification is that the clamping diodes such as Dc11 are incorporated into the modules such as M11. By this arrangement, voltage oscillation due to an inductance (L15 in FIGS. 2A and 2B) caused by a current flowing through the clamping diode can be substantially eliminated so that it is possible to reduce the dielectric strength and improve the output current density of the IGBT. Also, the erroneous operation caused by a voltage noise can be reduced. A second modification is that a snubber diode Ds11 can be incorporated in the module, or more specifically, the clamping diode Dc11 and the snubber diode Ds11 are incorporated in a single diode module Mp11 as shown in FIG. 3A, or the clamping diode Dc11 and the snubber diode DS11 are incorporated in a module M11 as shown in FIG. 3B. Because of this, the voltage noise generated by a current flowing through the snubber diode Ds11 and a snubber capacitor Cs in switching can be further reduced, the devices can be achieved with low dielectric strength, a reduction of chip size due to the improvement of the output current density can be achieved, and the three-level inverter device can be reduced in size by use of the module integratedly including the devices. As a result, the width of the inventer for use in train can be reduced from 3.32 to 1.6 m which is a half of the conventional device. Additionally, the noise reduction improves the reliability of the switching device, and the inverter device does not suffer an erroneous switching action even if the current change rate (di/dt) is increased, or the switching speed is increased, so that high-frequency switching operation can be achieved. Conventionally, the switching speed is controlled to be limiting to about 2 kHz, but the switching operation can be achieved with over 5 kHz in accordance with the present invention. By the high-frequency switching operation, the motor efficiency is improved, and the noise is reduced to 65 dB from the conventional level of 80 dB.

Figure 4A:
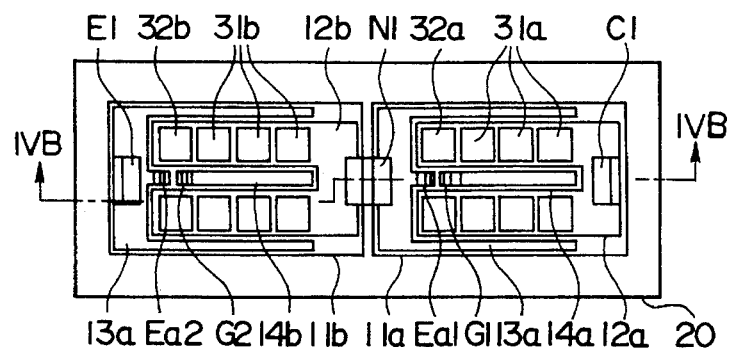
FIGS. 4A, 4B, 4C and 4D show a plan view, a sectional view taken along the line IVB–IVB of FIG. 4A, an external view and an equivalent circuit of an embodiment of a module using IGBTs in the inverter device according to the present invention.
Figure 4B:
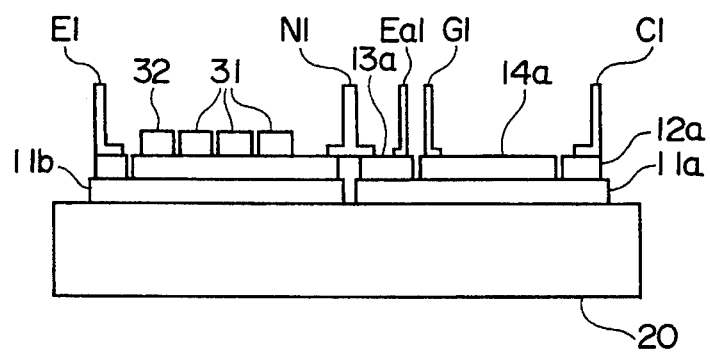
Figure 4C:
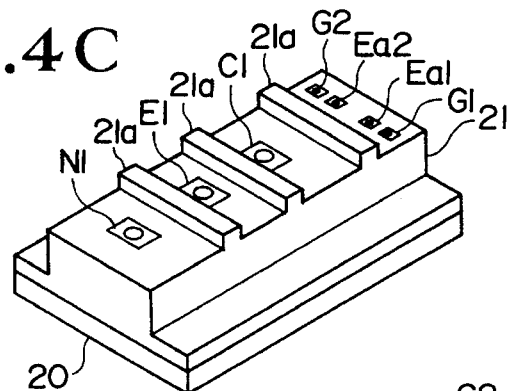
Figure 4D:
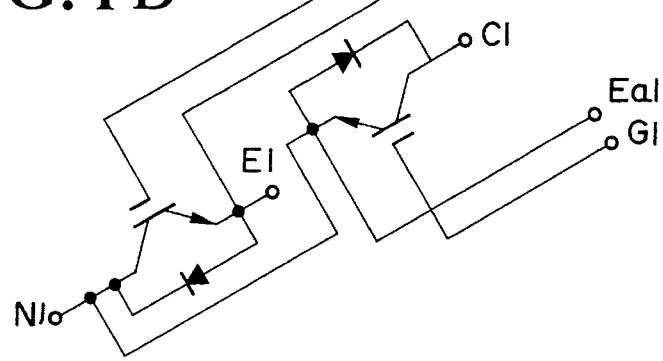

FIGS. 4A, 4B, 4C and 4D show a plan view, a sectional view, an external perspective view, and a circuit diagram of an example of a preferred module structure embodying the present invention. In FIG. 4A, reference numeral 20 denotes a metal substrate of copper, for example, and 11a and 11b denote two insulating plates separated from each other and attached on the metal substrate 20. Numerals 12a, 13a, 14a and 12b, 13b, 14b denote electrode plates attached respectively on the insulating plates 11a and 11b. The electrode plates 12a, 12b and 13a, 13b are formed with U-like shapes, and the leg portion of the electrode plates 12a and 12b are guided and placed between the leg portions of the electrode plates 13a and 13b. Strip-like electrodes plates 14a and 14b are guided and placed between the leg portions of the electrode plates 12a and 12b. One diode chip 32a and three IGBT chips 31a are mounted on each leg portion of the electrode plates 12a from the extreme end thereof in that order, while one diode chip 32b and three IGBT chips 31b are mounted on each leg portion of the electrode plates 12b from the extreme end thereof in that order. Each of the diode chips is connected to the electrode plates 13a, 13b and 14a, 14b by wire bonding (not shown). Reference numeral C1 denotes a collector terminal attached on a connecting part of the electrode plate 12a at one end in the longitudinal direction of the module, E1 denotes an emitter terminal attached on a connecting part of the electrode plate 13b at the other end in the longitudinal direction of the module, N1 denotes a central terminal attached on a connecting part of the adjacent electrode plates 12b and 13a in the center of the module, G1 and G2 denote gate terminals attached on the side of the electrode plates 13a and 13b which are close to the electrode plates 14a and 14b as shown in FIG. 4B, Es1 and Es2 denote emitter terminals for use in gate circuits attached on the part of the electrode plates 13a and 13b which are opposite to the electrode plates 14a and 14b, and 21 denotes a resin case attached to the metal substrate 20 to cover the module. Each of the terminals is exposed on the outer surface of the resin case 21 as shown in FIG. 4C, and each of the exposed portions is arranged on the surfaces partitioned by three protruding parts 21a extended to a direction transverse to the longitudinal direction of the resin case 21. It is noted that the gate terminals G1, G2 and the emitter terminals Es1, Es2 for the gate circuit are arranged on the same divided surface. This module expressed as a circuit diagram is shown in FIG. 4D. In the case that the inverter device in FIG. 1 is achieved by using these modules, each of the arms of the inverter device can be replaced with one of the modules.

In the module arranged as described, the electrode plates 12b and 13a are connected directly on their top surfaces by the central terminal N1 as shown in FIG. 4B, so that the reactance of the wiring can be reduced up to several nH and the advantages described referring to FIG. 1 can be achieved.

Figure 5A:
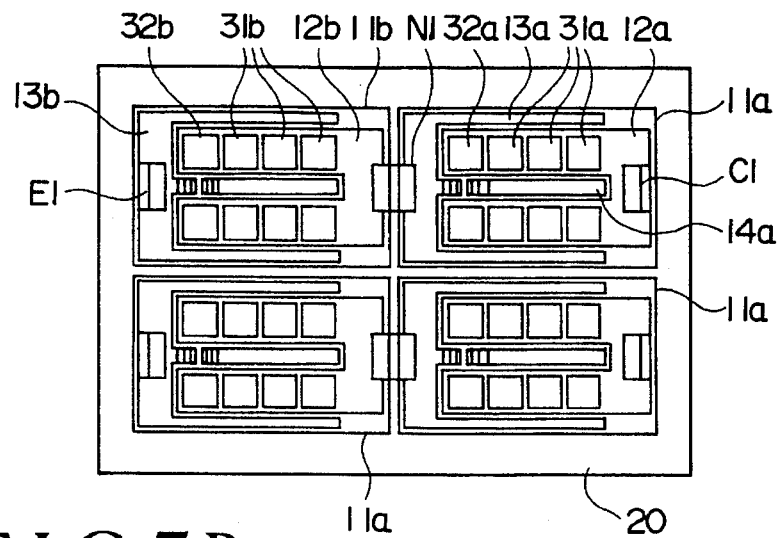
FIGS. 5A, 5B and 5C show a plan view, an external view and an equivalent circuit of another embodiment of a module using IGBTs for use in the inverter device according to the present invention.
Figure 5B:
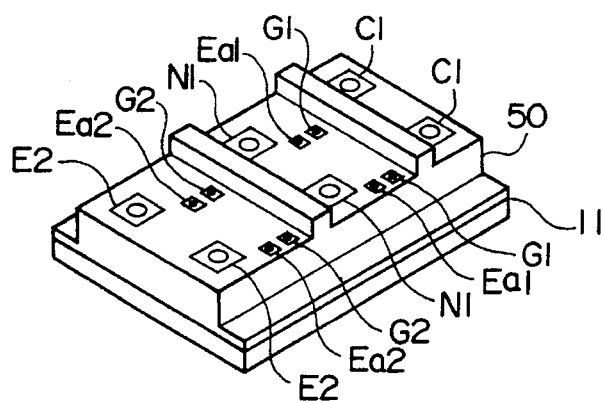
Figure 5C:
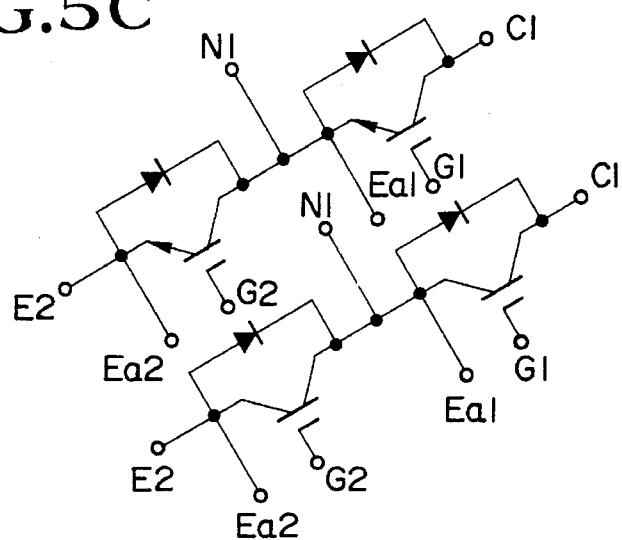

FIGS. 5A, 5B and 5C show a plan view, an external perspective view and a circuit diagram showing a modification of the module structure presented in FIGS. 4A, 4B, 4C and 4D. The difference from FIG. 4A is that two pieces of the module shown in FIG. 4A are arranged in parallel.

According to the module in the above structure, it is possible to double the output capacity by connecting the same terminals located side by side without increasing the wiring inductance compared with a case where two modules are used.

In the three-level inverter device shown in FIG. 1, lifetimes of the IGBTs used for the switching devices S11, S14, S21, S24, S31, S34 located close to the d.c. terminals T1 and T2 are preferably set shorter than that of the IGBTs used for the switching devices S12, S13, S22, S23, S32 and S33 located close to the a.c. terminals T4, T5 and T6, for purposes of achieving low losses. A description of this will be given in the following discussion. FIGS. 6A and 6B show losses at the output of each of the switching devices for one phase, formed by modules M11 and M12 of the three-level inverter device shown in FIG. 1. In this case, each of the switching devices and the diodes have almost the same lifetime and substantially the same electrical characteristics. It is noted that the switching loss of the switching devices S11 and S14 is greater than the loss caused by the on-state voltage as shown in FIG. 6A, and the loss caused by the on-state voltage of the switching devices S12 and S13 is far greater than the switching loss as shown in FIG. 6B. This means that the switching devices S11 and S14 require an increase in the switching speed by shortening the lifetime to decrease the switching loss. On the other hand, the switching devices S12 and S13 requires lengthening the lifetime to thereby reduce on-state voltage and decrease loss caused by the on-state voltage. In other words, in the three-level inverter device, it shows that the loss of each switching device is minimized and the loss of the module can be reduced by differing the lifetime even for the switching devices in a module. Especially, the IGBT among the switching devices can be changed in lifetime by more than one order of magnitude by electron beam irradiation, for example, which can freely and greatly change the switching loss and the loss by on-state voltage, therefore, the IGBT is suitable for use as a switching device of the three-level inverter device. The conventional power MOS transistor formed as a unipolar device cannot vary the relation between the switching loss and loss by on-state voltage. In a gate turn-off thyristor or a bipolar transistor, if the lifetime is modified, the gate (base) current changes. In a high-speed switching device, a very large current is required. In the case of a three-level inverter device, twice as many switching devices as in the conventional two-level inverter device are required. Therefore, an increase in the gate (base) current is not desirable because it leads to increase in the size of the control circuit, resulting in size increase of the inverter device. In addition, this is accompanied by a complexity that different control circuits are used for individual switching circuits. In contrast, when IGBTs are used, it is possible to select IGBTs with lifetimes matching a characteristic operation of the three-level inverter device, thereby reducing the power loss of the inverter device, and easily controlling the IGBTs with different electrical characteristics by the same control circuit. The power loss reduction by using different lifetimes for the IGBTs is possible with a three-level inverter device for applications having no regenerative mode. With a three-level inverter device for applications using a regenerative mode, the effect of power loss reduction is decreased because the relation between switching loss and loss by on-state voltage as shown in FIGS. 6A and 6B is reversed with a three-level inverter device for applications having a regenerative mode.

In the three-level inverter device shown in FIG. 1, the reduction of power loss can be achieved by increasing the lifetimes of the flywheel diodes D11, D12, D13, D14, D21, D22, D23, D24, D31, D32, D33 and D34 compared with the lifetimes of the clamping diodes Dc11, Dc12, Dc21, Dc22, Dc31 and Dc32. FIGS. 7A, 7B and 7C show a case in which diodes with substantially the same lifetime and substantially the same electrical characteristics are used for the flywheel diodes and the clamping diodes. For the flywheel diodes D11, D14, D21, D24, D31 and D34 on the d.c. terminals side, the recovery loss and the loss by forward voltage are substantially equal and balanced (FIG. 7A). Meanwhile, in the three-level inverter device, the recovery loss hardly occurs in the flywheel diodes D12, D13, D22, D23, D32 and D33 on the a.c. terminal side FIG. 7B. Therefore, it is desirable to elongate the lifetime of the flywheel diodes to reduce the loss by the forward voltage. Furthermore, with the clamping diodes Dc11, Dc12, Dc21, Dc22, Dc31 and Dc32, the loss by forward voltage is greater than recovery loss FIG. 7C, and therefore, it is desirable for power loss reduction for the clamping diodes to have a longer lifetime than flywheel diodes D11 and D14, and a shorter lifetime than the flywheel diodes D12 and D13. In this way, by giving different lifetimes to the diodes, the power loss in the diodes can be minimized.

As has been described, in the three-level inverter device, by setting different lifetimes for the IGBTs and diodes, the power loss in the whole inverter device can be reduced, with the result that the inverter device can be reduced in size.

Figure 8:
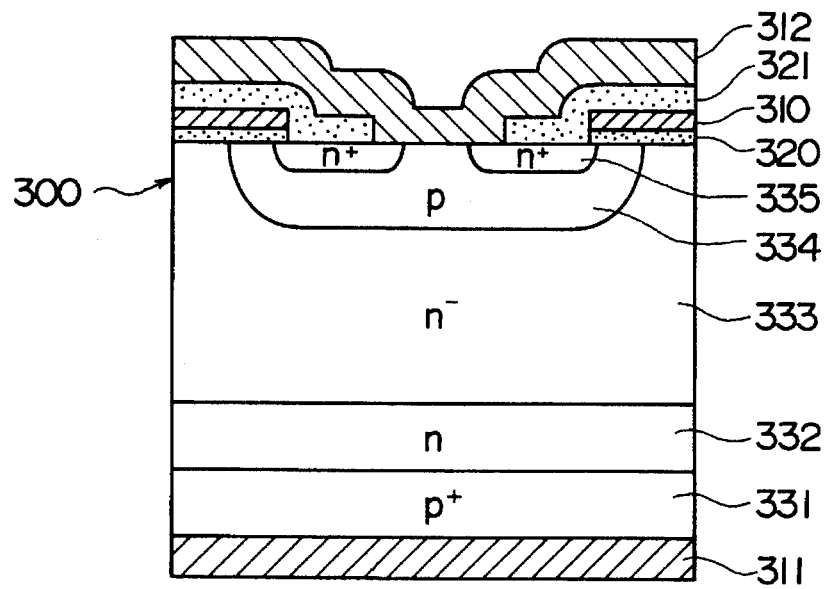
FIG. 8 is a sectional view showing an IGBT suitable for use in the inverter device according to the present invention.
Figure 9:
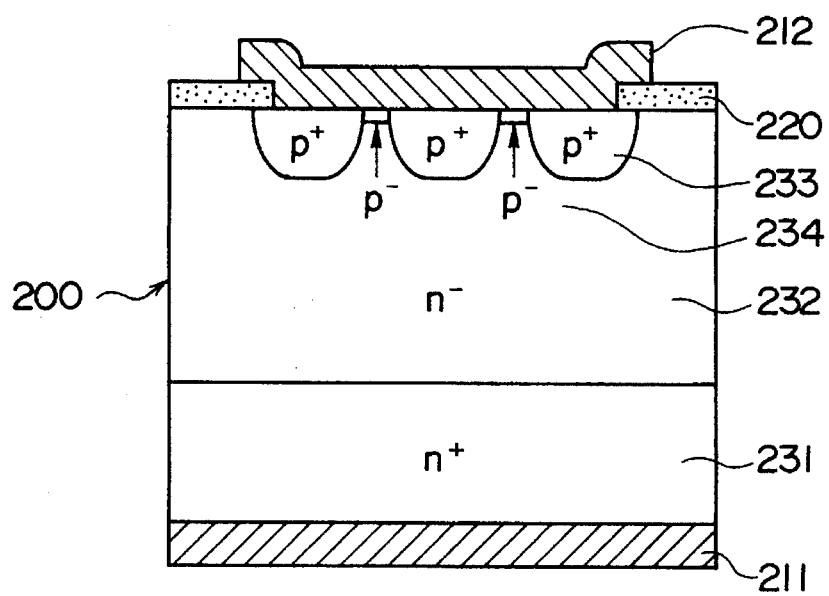
FIG. 9 is a sectional view showing a diode suitable for use in the inverter device according to the present invention.

FIGS. 8 and 9 show structures of an IGBT 300 and a diode 200 desirable for a three-level inverter device. The feature of the IGBT 300 in FIG. 8 is that an n-layer 332, a $p^+$-layer 331, a p-layer 334 and an $n^+$-layer 335 are all formed by diffusing impurities from the two principal surfaces into an $n^-$ type silicon wafer 333. The $p^+$-layer 331 is exposed at one principal surface, while the $n^-$-layer 333, the p-layer 334 and the $n^+$-layer 335 are exposed at the other principal surface. The $p^+$-layer is in ohmic contact with a collector electrode 311, the p-layer 334 and the $n^+$-layer are in Ohmic contact with an emitter electrode 312, and gate electrodes 310 are formed, through the intermediary of gate insulating layers 320, on the $n^-$-layer 333, the p-layer 334 and $n^+$-layer 335. The gate electrodes are separated from the emitter electrodes 312 by insulating layers 321. By forming all the layers by diffusion of impurities as described, an IGBT can be produced with better quality of the $n^-$-layer and a longer lifetime than in a conventional IGBT in which the $n^-$-layer is formed by epitaxial growth. Particularly, in the IGBTs with a dielectric strength of 2000 volt or higher used on the vehicle at a trolley voltage of 1500 volt or higher, an $n^-$-layer with resistivity of about 150 to 200 Ωcm is required, and if this layer is formed by epitaxial growth, many crystal defects are formed, which are conducive to short lifetime, with various lengths at that. On the other hand, silicon wafers produced by the pulling method (Czochralski) have better crystallinity and lifetimes which are unvaried and long. Therefore, by providing IGBTs with long lifetime, to begin with, and controlling the lifetime with electron beam irradiation or the like, IGBTs with various lengths of lifetime suitable for a three-level inverter device can be manufactured easily. Above all, silicon wafers irradiated with a neutron beam have a resistivity which is less varied, and the output current of a thus produced IGBT is stable.

If the $p^+$-layer is formed by impurity diffusion, the impurity concentration of the $p^+$-layer can be made higher by about one order of magnitude than a $p^+$-substrate wafer made by the pulling method used in the epitaxial growth system, and the $p^+$-layer can be formed with a thin thickness of about several 100 microns to about 10 microns. Thus, the injection efficiency of holes from the $p^+$-layer can be improved. Also, the voltage drop in the $p^+$-layer can be reduced, and the output current density of the IGBT can be improved, so that the size of the inverter device can be decreased.

FIG. 9 shows a diode 200 made in the same manner as in the above case by forming all layers by diffusing impurities into an $n^-$-layer silicon wafer 232. Like the case of the multilayer structure in FIG. 8, the lifetime is controllable and a high output can be obtained, so that needless to say, the size reduction of the three-level inverter device can be achieved. A cathode electrode 211 is in low-resistance contact with an $n^+$-layer 231. An anode electrode 212 forms ohmic junctions with $p^+$-layers 233, and also forms Schottky junctions with $p^-$-layers 234. By using the Schottky junctions, the injection of holes from the $p^-$-layer 234 to the $n^-$-layer 232 is suppressed, thereby reducing the recovery loss due to the stored carriers. On the other hand, in a conventional diode in which the whole surface of the anode diode is in ohmic contact with the $p^+$-layer, the output current density can be made higher than in the diode in FIG. 9, and when diodes of this type are used in a three-level inverter device as the a.c.-terminal-side flywheel diodes in which switching loss hardly occurs, a much greater loss reduction of the inverter device can be obtained. The diode in FIG. 9 in which the recovery loss is small is suitable for use as the clamping diodes Dc11, Dc12 and the d.c.-terminal-side flywheel diodes D11, D14, and should preferably be used for D11 and D14. Furthermore, since the diode in FIG. 9 exhibits a soft recovery characteristic, and has a small current change rate di/dt, this diode contributes to the reduction of voltage noise, and is effective in achieving the reduced voltage and the high reliability of the devices.

Figure 10:
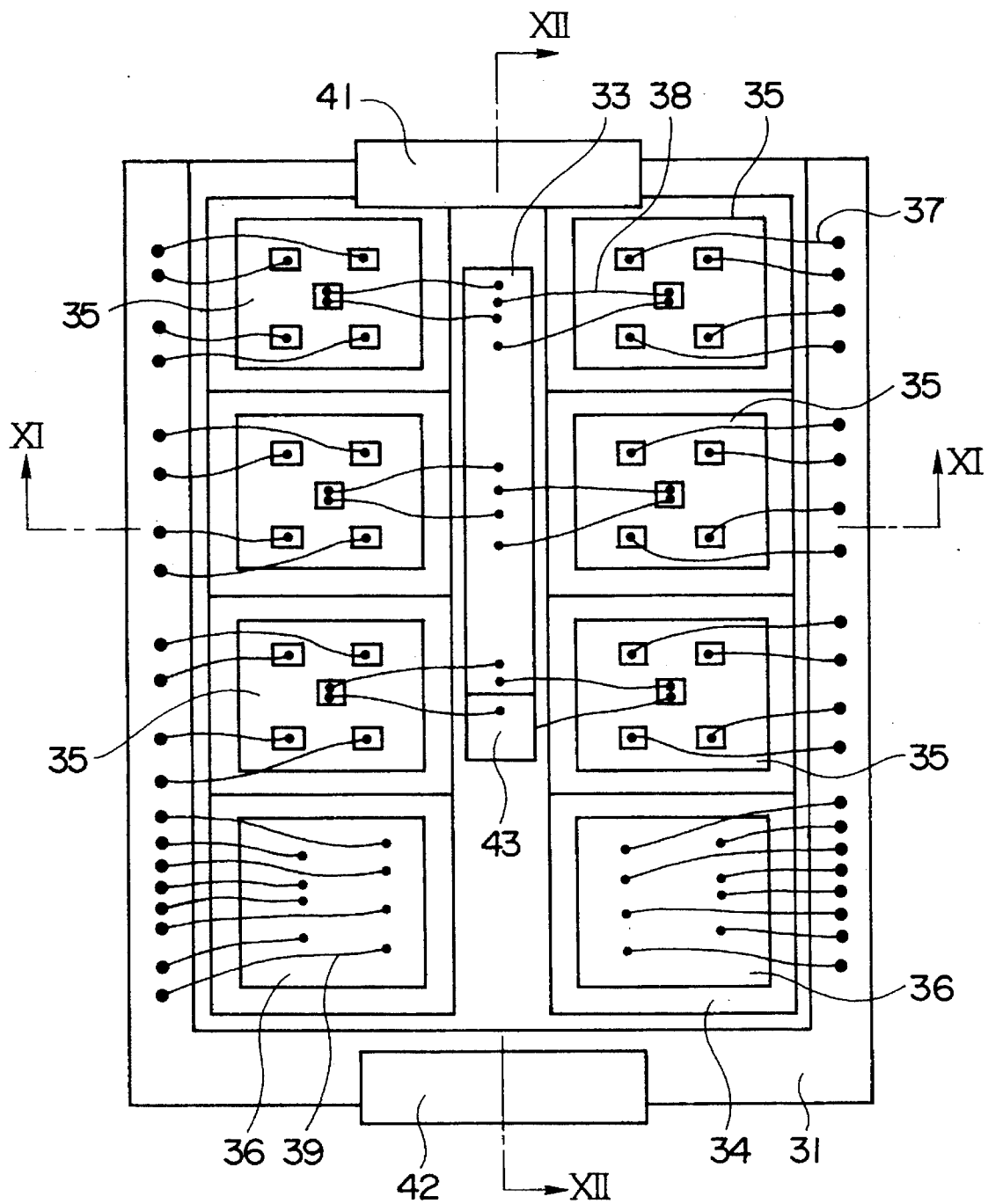
FIG. 10 is a schematic plan view showing an embodiment of a semiconductor module of the present invention.
Figure 11:
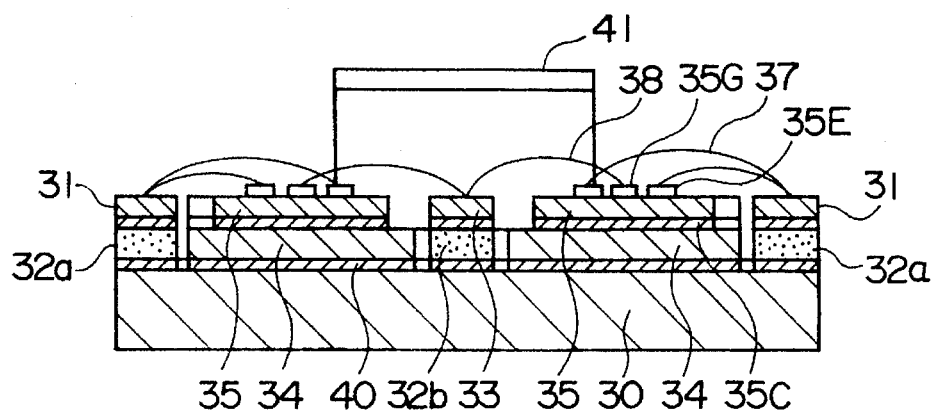
FIG. 11 is a schematic sectional view taken along the line XI—XI of FIG. 10.
Figure 12:
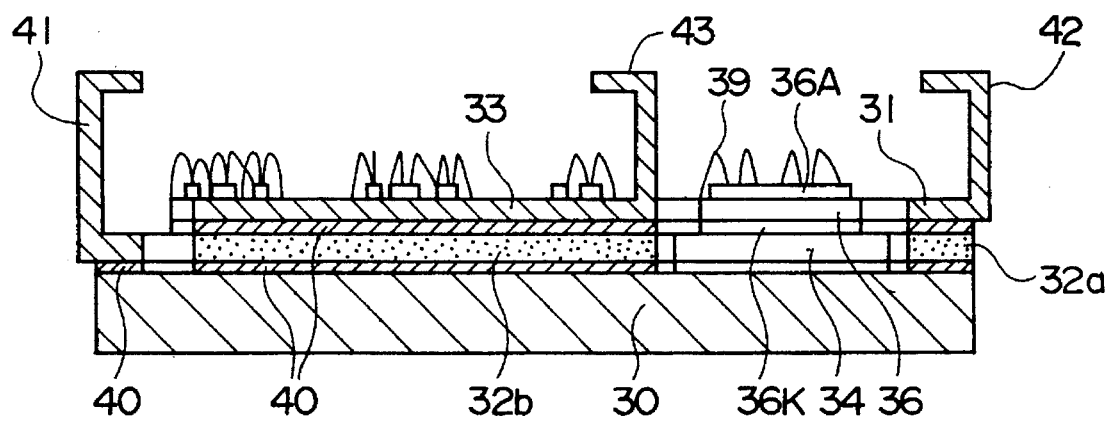
FIG. 12 is a schematic sectional view taken along the line XII—XII of FIG. 10.

FIGS. 10, 11 and 12 are a plan view and sectional views of a minimum unit of a semiconductor module used in a power converting device. In those figures, reference numeral 30 denotes a rectangular metal substrate formed by copper, for example, 31 denotes a first electrode layer in the form of U-like shape mounted on the peripheral portion of the metal substrate 30 through the intermediary of an insulating layer 32a of alumina, for example, 33 denotes a strip-shaped second electrode plate substantially parallel with two sides of the first electrode plate 31 which are parallel in their longitudinal directions, 34 denotes buffer plates made of a metal material, such as molybdenum, with a thermal expansion coefficient close to that of a semiconductor and mounted on the metal substrate 30 and separated from the first electrode plate 31 and the second electrode plate 33 and surrounding the second electrode plate 33, 35 denotes rectangular IGBT chips in two rows, each row comprising three chips between the two parallel sides of the first electrode plate 31 and the second electrode plate 33 above the buffer plates 34, and 36 denotes two rectangular diode chips disposed side by side at two corners formed by the two parallel sides and the other side of the first electrode plate 31 above the buffer plate 34. Each IGBT chip 35 has a couple of principal surfaces, with a collector electrode 35C provided on one principal surface so as to face the buffer plate 34, and with emitter electrodes 35E and a gate electrode 35G provided on the other principal surface. The diode chip 36 has a pair of principal surfaces, with an anode electrode 36A provided on one principal surface and a cathode electrode 36K provided on the other principal surface so as to face the buffer plate 34. Reference numerals 37, 38 and 39 denote bonding wires of aluminum, for example, which connect between the emitter electrodes 35E of IGBT chips 35 and the first electrode plate 31, between the the gate electrode 35G of the IGBT chips 35 and the second electrode plate 33, and between the anode electrodes 36A of the diode chips 36 and the first electrode plate 31. Numeral 40 denotes a bonding layer such as solder, 41 denotes a first extension terminal extending from an open end side of the first electrode plate 31 of the metal substrate 30, numeral 42 denotes a second extension terminal extending from that part of the other side intermediate between the two sides of the first electrode plate 31, which is electrically close to the diode chips 36, and 43 denotes a third extension terminal extending from the second electrode plate 33. Those extension terminals may be formed as integral parts of the electrodes, or they may be made separately and directly or indirectly bonded to the electrodes.

Figure 13A:
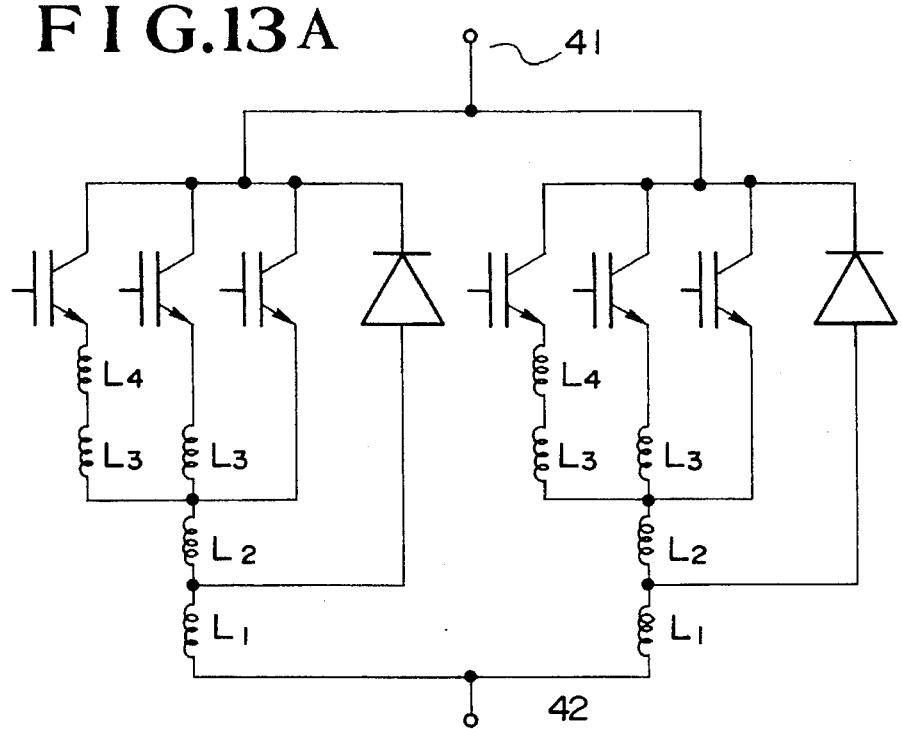
FIGS. 13A and 13B are equivalent circuits of the semiconductor module in FIG. 10 and its explanatory diagram.
Figure 13B:
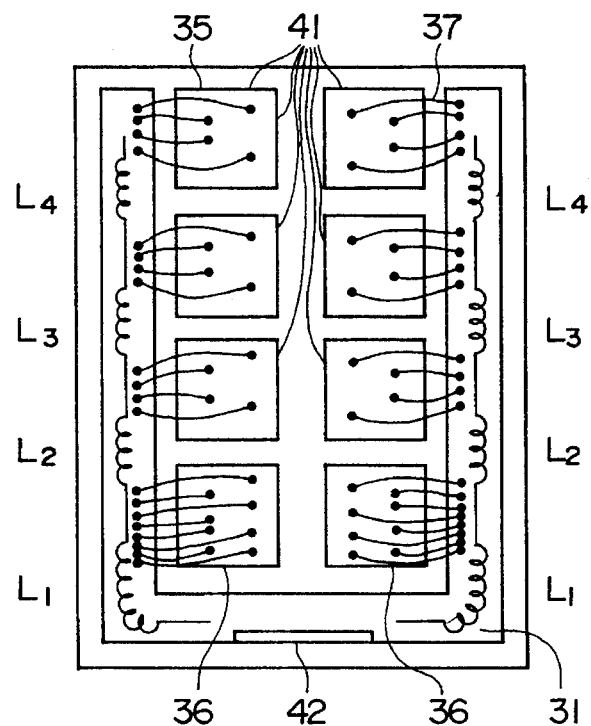

FIG. 13A is an equivalent circuit of the semiconductor module constructed as described. To be more specific, the circuit in FIG. 13A is configured such that two parallel circuits, each having three IGBT chips 35 and a diode chip 36 in parallel, are connected in parallel. L1, L2, L3 and L4 denote wiring inductances of the first electrode plate 31 as shown in FIG. 13B. L1 denotes a wiring inductance from the second extension terminal 42 to the junction points between the bonding wires 39 of a diode 36 and the first electrode plate 31, L2 denotes a wiring inductance from the junction points between the bonding wires 39 of the diode chip 36 and the first electrode plate 31 to the junction points between the bonding wires 37 of an IGBT chip 35 adjacent to the diode 36 and the first electrode plate 31, and L3 and L4 denote wiring inductances between the junction points of the bonding wires 37 of the IGBT chips 35 and the first electrode plate 31. The wiring inductance L1 is small because of the second extension terminal 41 being close to the junction points of the bonding wires 39 of the diode chip 36 and the first electrode plate 31. For this reason, the current oscillation which occurs due to the wiring inductance L1 when the diodes turn off is extremely small, so that the IGBTs are less liable to be incorrectly turned-on, and the switching loss is reduced when the IGBTs turn off. Furthermore, because the wiring inductances (L1+L2) in series are connected similarly for all of the IGBT chips, differences among the wiring inductances L1+L2, L1+L2+L3 and L1+L2+L3+L4 from the second extension terminal 42 to the respective IGBTs are reduced, so that the current nonuniformity between the IGBT chips 35 is decreased. Also, since the size of the metal substrate 30 is large, there is hardly any difference in wiring inductance on the metal substrate 30 among the IGBT chips, so that the nonuniformity in the current density among the IGBT chips is reduced and the breakdown voltage is increased. This will be described further showing concrete numerical values. Suppose that the wiring inductance L1+L2 is 50 nH, L3 is 15 nH, and L3+L4 is 30 nH. When the wiring inductance L1+L2 existing in series for all IGBTs is zero, the nonuniformity of the current density among the IGBTs is 45%. According to the present invention, however, the nonuniformity of the current density is about 20% or less, which is a great reduction compared with the case where the inductance L1+L2 is zero. Generally, if the diode chips are arranged remotely from the second extension terminal 21 and the wiring inductance L1 is about 100 nH, it sometimes occurs that the oscillating voltage at the time of recovery is about 8% and the voltage value reaches 100 volt or higher, so that noise of about several tens of volt occurs at the gate electrodes, giving rise to malfunctioning of the switching devices. In contrast, with the module structure according to the present invention, when the wiring inductance L1 is about 10 nH, the oscillating voltage value at the time of recovery is reduced sharply to about 10% or below.

To further reduce the differences among the wiring inductances among the IGBT chips, it is effective to decrease the inductances L3 and L4. For example, in the layout of FIG. 13B, the inductance L4 can be reduced by placing the junction points of the first electrode plate 31 and the bonding wires of the remotest IGBT chip from the second extension terminal 42 as close to the second extension terminal 42 as possible. In addition, the inductance L3 is reduced significantly and the inductance L2 is increased by forming a structure that the junction points of the first electrode plate 31 and the bonding wires of the closest IGBT chip to the second extension terminal 42 are placed as close as possible to the junction points of the first electrode plate 31 and the bonding wires of the remotest IGBT chip from the second extension terminal 42. By this arrangement, the differences in the wiring inductance among the IGBT chips are decreased, and the nonuniformity in the current density among the IGBT chips is further reduced. To reduce the differences in the wiring inductance of the still further, it is necessary to decrease the inductance L1. To this end, in the layout of FIG. 13B, for example, it is effective to form a module structure such that the junction points of the bonding wires of the diode chips and the first electrode plate 31 are brought as close to the second extension terminal 42 as possible.

Moreover, because of the arrangement that the six small IGBT chips 35 and two small diode chips 36 are disposed separately on the metal substrate 30, the heating-generating parts are dispersed in the module and the module temperature is uniformly maintained. Therefore, the local temperature rises in the metal substrate 30 are eliminated, and the shortening of the service life of the bonding layer and the bonding wires can be avoided which results from thermal stress.

By arranging the IGBT chips 35 and the diode chips 36 between the first electrode plate 31 and the second electrode plate 33, the length of the electrode from the second extension terminal 42 or the third extension terminal 43 to the bonded points of the bonding wires is made short, so that the wiring inductances leading to the gate electrodes 35G and the emitter electrodes 35E of the IGBT chips can be decreased. By this arrangement, a steep-rising voltage of the IGBT chips can be reduced, so that their dielectric strength and the on-stage voltage can be decreased.

Additionally, owing to the arrangement that the first extension terminal 41 and the second extension terminal 42 are placed at the opposed sides in the longitudinal direction of the metal substrate 30, it is easy to elongate the creeping distance over the external surface of the module between the terminals, and the increased dielectric strength of the module can be obtained.

Furthermore, the chips, electrodes and terminals are arranged substantially in symmetric form with respect to the central axis connecting between the second extension terminal 42 leading to the emitter electrodes and the first extension terminal 41 leading to the collector electrodes. Owing to this structure, the wiring length from the terminals to the respective IGBT chips is substantially equal, so that all wiring inductances including the wiring inductances leading to the emitter electrodes, the wiring inductances leading to the collector electrodes, and the wiring inductances leading to the gate electrodes, are equal with respect to the individual chips, so that the nonuniformity of current among the chips can be eliminated. Therefore, the increased dielectric strength of the IGBT chips can be achieved easily and the heat distribution of the module can be made uniform.

The other advantages according to the present invention are:

(1) Since there are more than two bonding wires connecting each gate electrode and the second electrode plate 33, even if one wire is disconnected, another wire remains intact, so that the gate potential is prevented from assuming a floating state, and the dielectric strength is secured for a long service life. (2) Being small in size, the chips can be manufactured with a high yield. (3) The emitter electrodes on which many bonding wires are connected have a wide area, and the chips are placed between the first electrode plate 31 and the second electrode plate 33, so that wire bonding work can be performed easily. (4) The chips 35 and 36 are attached to the metal substrate 30 through the intermediary of buffer plates without interposition of insulating layers, and therefore, the thermal fatigue of the bonding layers can be reduced.

With regard to the embodiments shown in FIGS. 10, 11 and 12, description has been made of a case in which six IGBT chips and two diodes are used. Needless to say, the present invention can be applied to modules having many more chips connected in parallel and the same effects as described can be expected.

Figure 14:
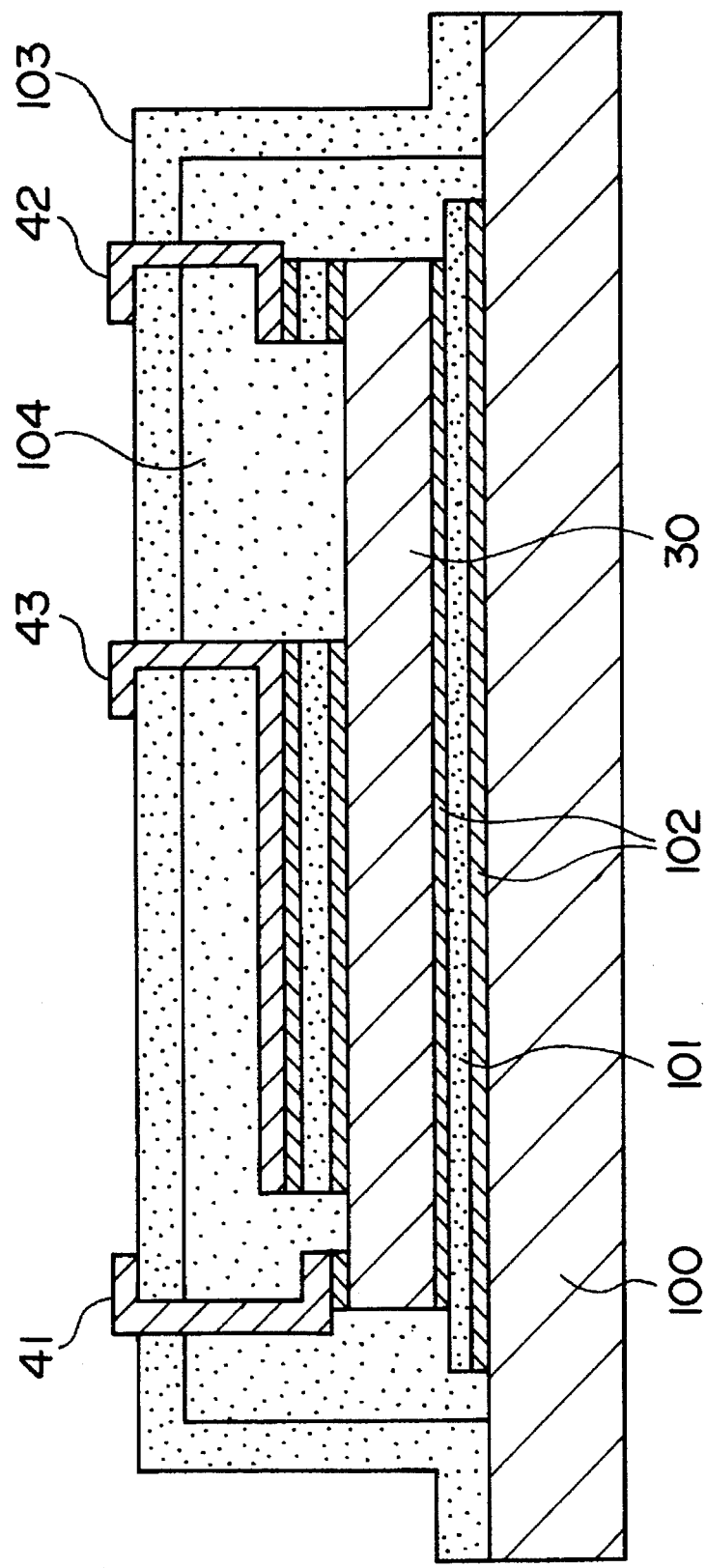
FIG. 14 is a schematic sectional view corresponding to FIG. 11 showing the state of use of the semiconductor module of the present invention.

FIG. 14 shows the way in which the semiconductor module shown in FIGS. 10, 11 and 12 is used. In FIG. 14, reference numeral 100 denotes a support substrate on which the first electrode plate is mounted through the intermediary of an insulating layer, 102 denotes a bonding layer, 103 denotes an insulating cap forming a container to accommodate a semiconductor module jointly with the support substrate 100, and 104 denotes an insulating resin filled in the container. The semiconductor module according to the present invention is normally used in this state.

Figure 15:
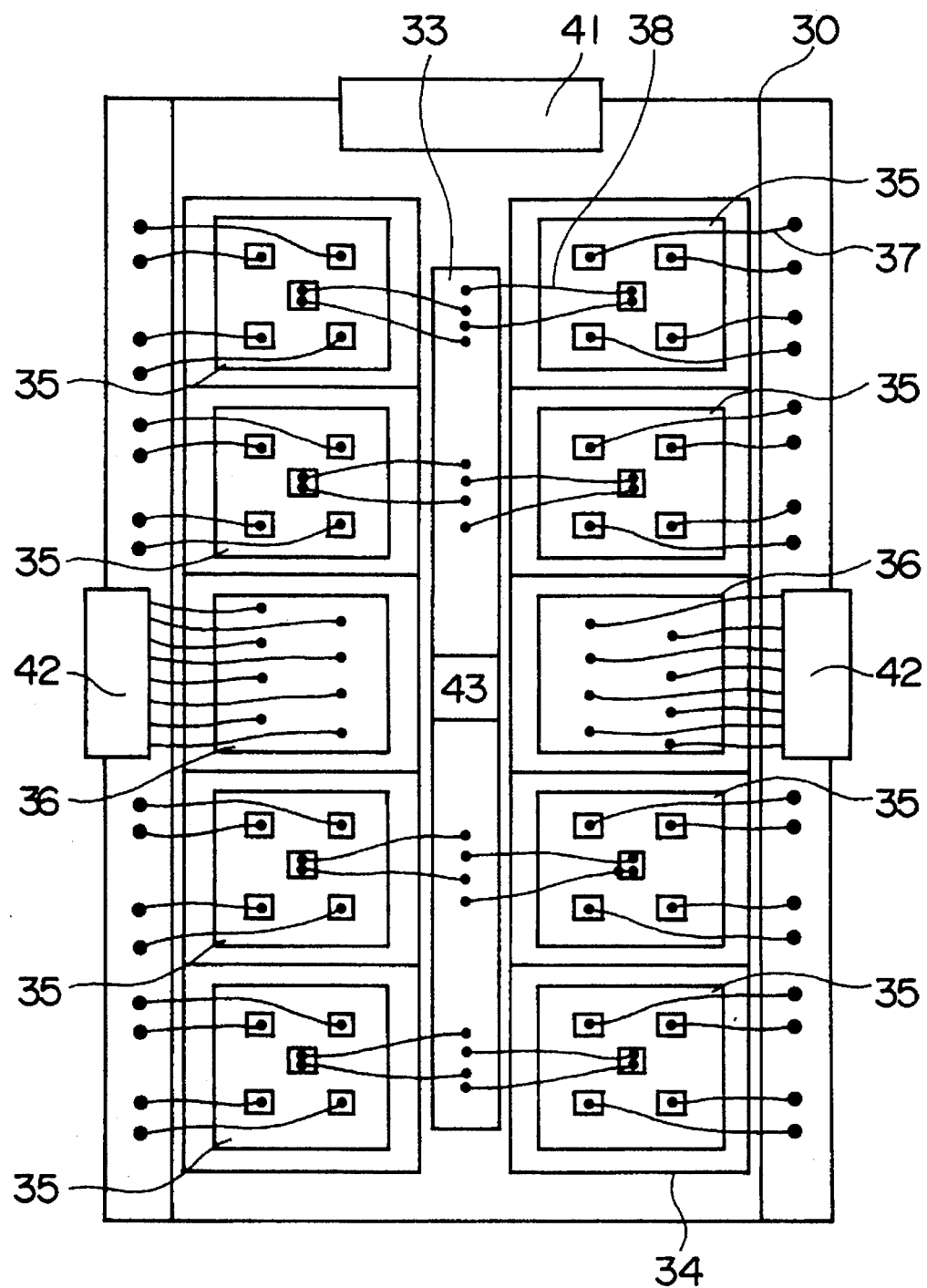
FIG. 15 is a schematic plan view showing another embodiment of the semiconductor module of the present invention.
Figure 16:
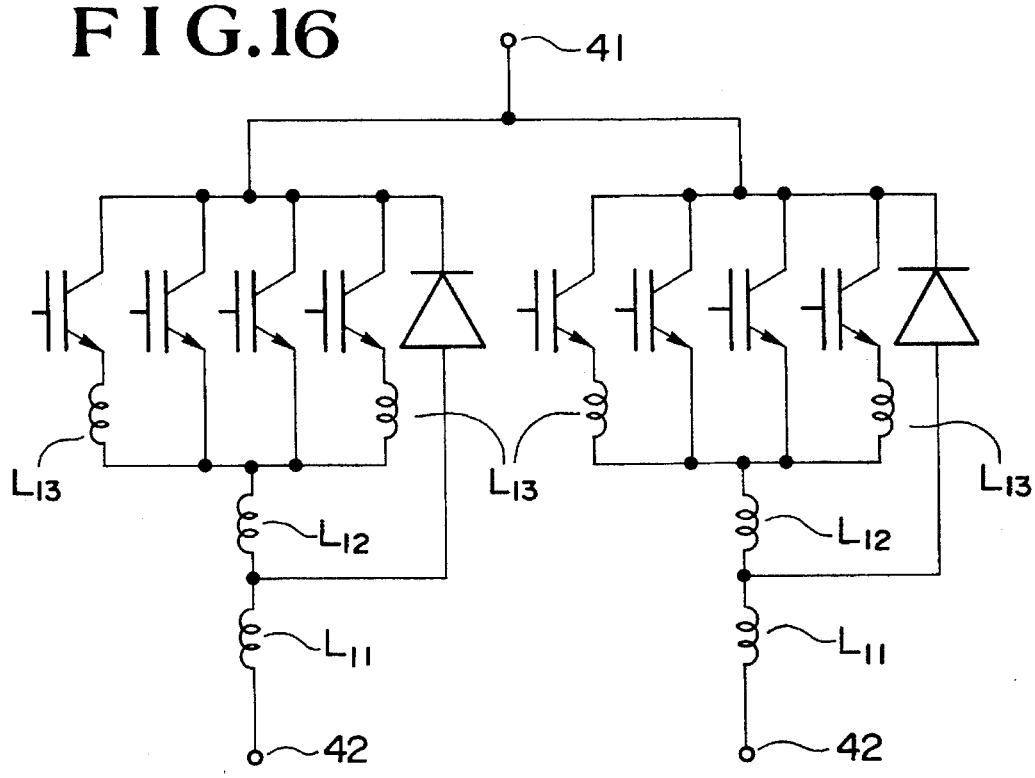
FIG. 16 is an equivalent circuit diagram of the semiconductor module in FIG. 15.

FIG. 15 shows another embodiment of the semiconductor module according to the present invention. The structural feature of this embodiment is that two strip-shaped first electrode plates are disposed at the opposed sides parallel with the longitudinal direction of the metal substrate 30, two rows of chips, each row comprising four IGBT chips 35 and one diode chip 36 in the middle of the row, are provided along the respective first electrode plates 31, a strip-shaped second electrode plate 33 located between the two rows of chips, and two second extension terminals at the positions of the two first electrode plates 31 which are close to the diode chips 36. An equivalent circuit of the semiconductor module structured as described is shown in FIG. 16. Compared with the circuit in FIGS. 13A and 13B, there is no wiring inductance L4, and therefore, the differences between the wiring inductances L11+L12 and L11+L12+L13 from the second extension terminal 42 to the respective IGBT chips are further reduced, so that the current nonuniformity among the IGBT chips is further decreased. L11 denotes the wiring inductance of the second extension terminal 42, L12 denotes the wiring inductance of the first electrode plate 31 between two sets of junction points, one set of junction points being between the first electrode plate 31 and the bonding wires connecting the anode electrode of a diode chip 36 with the second electrode plate 33, and the other set of junction points being between the first electrode plate 31 and the emitter electrodes of the IGBT chip 35 adjacent to the diode chip 36, L13 denotes the wiring inductance of the first electrode plate 31 between two sets of junction points, one set of junction points being between the first electrode plate 31 and the bonding wires connecting the first electrode plate 31 with the emitter electrodes of the IGBT chip 35 adjacent to the diode chip 36, and the other set of junction points being between the first electrode plate 31 and the bonding wires connecting the first electrode plate 31 with the emitter electrodes of the IGBT chip 35 adjacent to the diode chip 36.

Figure 17:
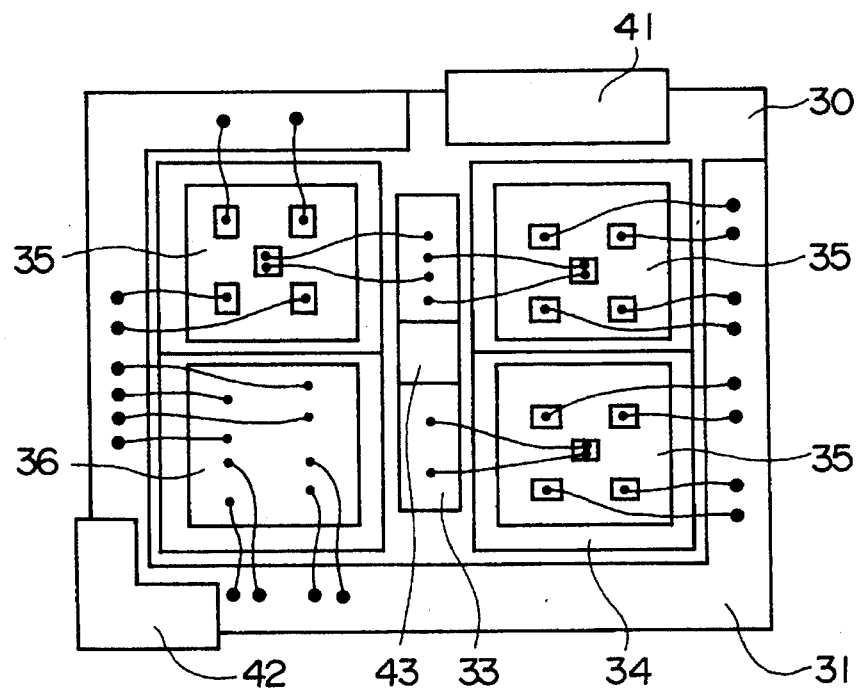
FIG. 17 is a schematic plan view showing yet another embodiment of the semiconductor module of the present invention.

FIG. 17 shows yet another embodiment of the semiconductor module according to the present invention. The structural feature of this embodiment is that three IGBT chips 35 and one diode chip 36 are arranged in two rows of two chips, the first electrode plate 31 is disposed to extend from the diode chip 36 to the IGBT chips 35 and surround at least three sides of the chips and the second electrode plate 33 is placed between the chips so as to be adjacent to the chips. Even in this structure, the wiring inductance from the second extension terminal 42 to that part where the bonding wires of the diode chip are connected to the first electrode plate 31 is minimum, and this wiring inductance is in series with all IGBT chips, so that the current nonuniformity among the IGBT chips is reduced, with the result that noise is less likely to occur and the switching loss is reduced. This embodiment offers an effect that the substantially square shape of the metal substrate makes it easier to obtain the uniformity of the bonding layer thickness than in the rectangular metal substrate in other embodiments.

Figure 18:
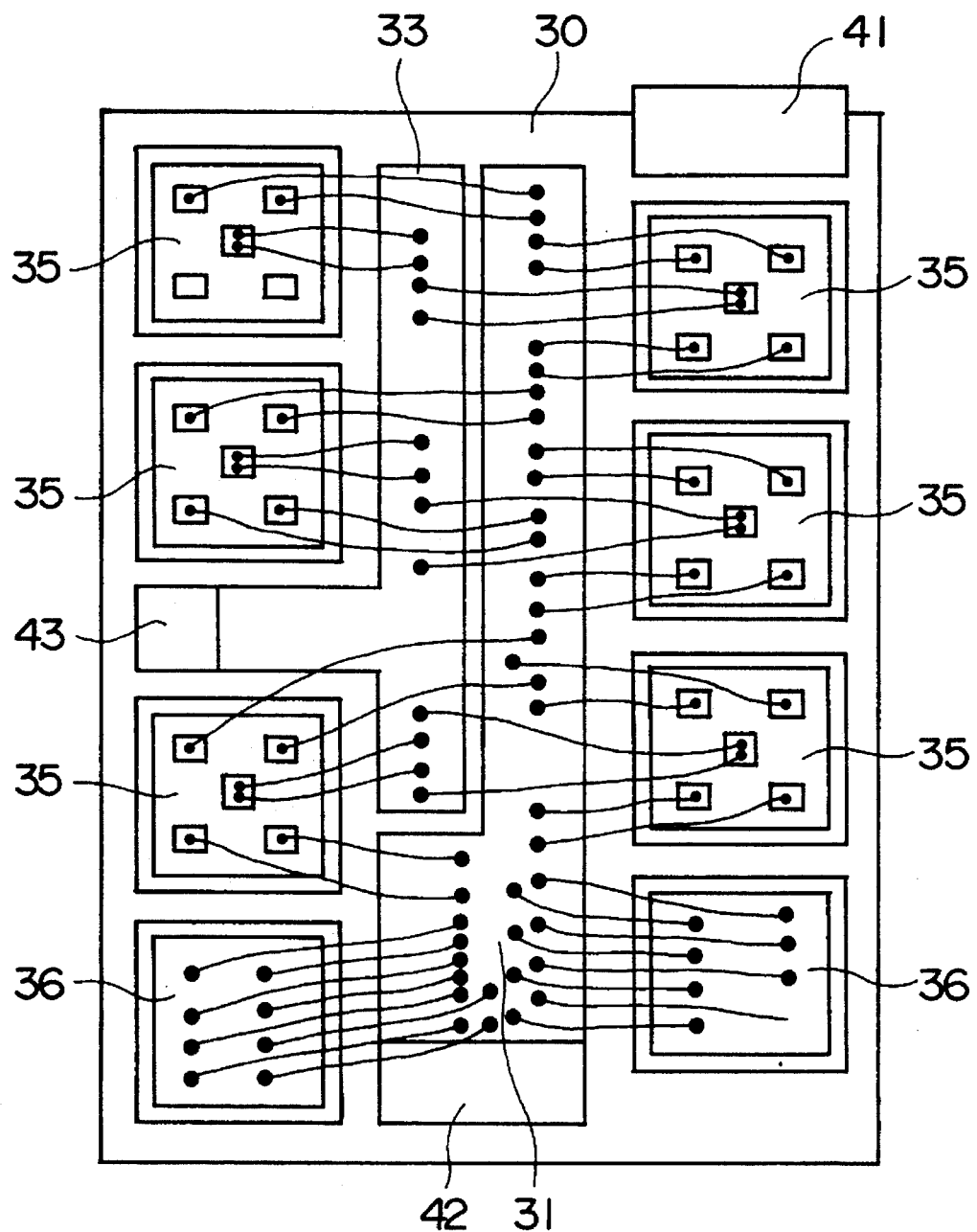
FIG. 18 is a schematic plan view showing a different embodiment of the semiconductor module of the present invention.

FIG. 18 shows another embodiment of the semiconductor module according to the present invention. The feature of this structure lies in that the first electrode plate 31 and the second electrode plate 33 are arranged in the center, and two rows of chips, each row comprising three IGBT chips 35 and one diode chip 36, are disposed on the opposite sides of the module. The other structural details do not differ from the embodiments shown in FIGS. 10, 11 and 12, and therefore, the nonuniformity of current among the IGBT chips is reduced, thereby leaving less chance for noise to occur and reducing the switching loss.

The present invention is not limited to the embodiments described above.

Figure 19:
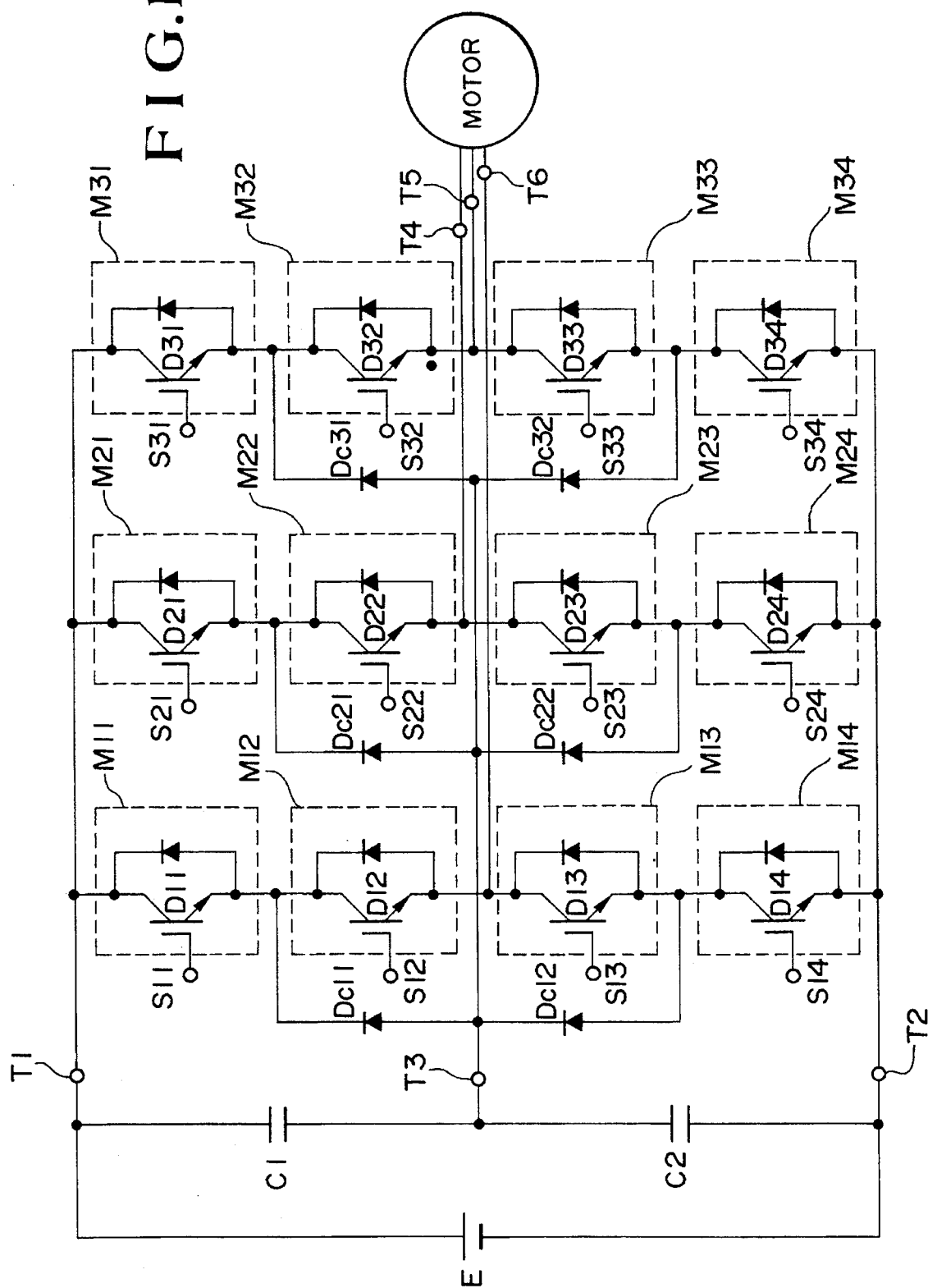
FIG. 19 is a circuit diagram showing a three-level inverter device using a semiconductor module of the present invention.

According to the present invention, the voltage noise in a three-level inverter device as shown in FIG. 19 can be reduced, which makes it possible to reduce the dielectric strength of the switching devices and the diodes, as a result, the output of the devices can be increased, and the downsizing of the devices and the inverter device can be attained. Furthermore, by varying the lifetimes of the IGBTs used as the switching devices and the diodes according to the operation of the three-level inverter device, it is possible to reduce the loss of the IGBT module, decrease the size of the cooling device, and decrease the whole size of the inverter device. Moreover, because the voltage noise due to a current change is reduced, the switching devices have high reliability, a high-frequency switching operation can be achieved, and noise can be reduced. In addition, since the second extension terminal is provided near the diode chip, the wiring inductance of the first electrode layer in the vicinity of the diode chip is connected in series with a plurality of IGBT chips, and the differences of wiring inductance among the IGBT chips is lessened, so that the nonuniformity of current among the chips can be reduced. By this structure, the wiring inductance L in the vicinity of the diode chip can be minimized. Therefore, even when the current change di/dt at the time of switching is large, a current overshoot is small, a noise current to the gate electrodes by current oscillation is reduced, and an increase in power consumption can be avoided. Other effects provided by the present invention are that the large chip area of the IGBT module enables a large-current switching, owing to the separate and wide distribution of the heat-generating parts and the reduced and fairly uniform wiring inductances, the current density and the exothermic density are made uniform, the dielectric strength is high, the fatigue life of the solder and wires is long, and the module size is small.

We claim:

1. An inverter device comprising:

a pair of d.c. terminals;

an intermediate node at a potential intermediate between the potentials of said pair of d.c. terminals;

a.c. terminals equal in number to the number of phases of the inverter device;

a plurality of arms each connected between one of said d.c. terminals and one of said a.c. terminals, each of said arms comprising two parallel circuits connected in series, each parallel circuit including a switching device and a diode opposite in polarity to said switching device; and a plurality of diodes each connected between said intermediate node and a node between the parallel circuits of a corresponding one of the arms, wherein each of said arms is formed by a single module, each said single module including: a metal substrate, a plurality of insulation plates disposed on said metal substrate; a plurality of electrode plates disposed on each of said insulation plates; a switching device chip and a diode chip disposed on at least one of said electrode plates on each of said insulation plates; and a plurality of terminals disposed on said electrode plates, and wherein a lifetime control is applied to said switching devices located close to said d.c. terminals so that lifetimes of said switching devices located close to said d.c. terminals are shorter than lifetimes of said switching devices located close to said a.c. terminals to decrease switching losses and decrease switching times of said switching devices located close to said d.c. terminals;

wherein said lifetime control comprises irradiating said switching devices located close to said d.c. terminals with an electron beam to provide said shorter lifetimes.

2. An inverter device comprising:

a pair of d.c. terminals;

an intermediate node at a potential intermediate between the potentials of said pair of d.c. terminals;

a.c. terminals equal in number to the number of phases of the inverter device;

a plurality of arms each connected between one of said d.c. terminals and one of said a.c. terminals, each of said arms comprising two parallel circuits connected in series, each parallel circuit including an insulated gate bipolar transistor and a diode opposite in polarity to said insulated gate bipolar transistor; and a plurality of diodes each connected between said intermediate node and a node between the parallel circuits of a corresponding one of the arms, wherein each of said arms is formed by a single module, each said module including: a metal substrate; a plurality of insulation plates disposed on said metal substrate; a plurality of electrode plates disposed on each of said insulation plates; an insulated gate bipolar transistor chip and a diode chip disposed on at least one of said electrode plates on each of said insulation plates; and a plurality of terminals disposed on said electrode plates, and wherein a lifetime control is applied to said insulated gate bipolar transistors located close to said d.c. terminals so that lifetimes of said insulated gate bipolar transistors located close to said d.c terminals are shorter than lifetimes of said insulated gate bipolar transistors located close to said a.c. terminals to decrease switching losses and decrease switching times of said insulated gate bipolar transistors located close to said a.c. terminals;

wherein said lifetime control comprises irradiating said insulated gate bipolar transistors located close to said d.c. terminals with an electron beam to provide said shorter lifetimes.

3. An inverter device comprising:

first d.c. terminals connected to a high potential point of a d.c. power source circuit;

second d.c. terminals connected to a low potential point of the d.c. power source circuit;

third d.c. terminals connected to an intermediate potential node having a potential intermediate between the high potential point and the low potential point of the d.c. power source circuit;

a.c. terminals equal in number to the number of phases of the a.c. output;

a plurality of single inverters, equal in number to the number of phases of the a.c. output, connected in parallel between said first d.c. terminals and said second d.c. terminals, wherein each of the single inverters includes an intermediate point connected to one of said a.c. terminals, wherein each of said single inverters includes: first, second, third and fourth insulated gate bipolar transistors connected in series; first, second, third and fourth diodes respectively connected in parallel with each of said insulated gate bipolar transistors in opposite polarity to said insulated gate bipolar transistors; a fifth diode connected to an intermediate node of said first and second insulated gate bipolar transistors and to one of third d.c. terminals, and a sixth diode connected to an intermediate node of said third and fourth insulated gate bipolar transistors and to said one of said third d.c. terminals, and wherein in each of said single inverters said first and second insulated gate bipolar transistors and said first and second diodes comprise a first single module, and said third and fourth insulated gate bipolar transistors and said third and fourth diodes comprise a second single module, which each of said first and second single modules comprises: a metal substrate; a plurality of insulation plates disposed on the metal substrate; a plurality of electrode plates disposed on each of the insulation plates, and a plurality of terminals disposed on each of the electrode plates, wherein the first and second insulated gate bipolar transistors and first and second diode chips forming said first and second diodes are disposed on at least one of the electrode plates on an insulation plate of said first single module, and wherein the third and fourth insulated gate bipolar transistors and third and fourth diode chips forming said third and fourth diodes are disposed on at least one of the electrode plates on an insulation plate of said second single module, and wherein a lifetime control is applied to said first and fourth insulated gate bipolar transistors so that lifetimes of said first and fourth insulated gate bipolar transistors are shorter than lifetimes of said second and third insulated gate bipolar transistors to decrease switching losses and decrease switching times of the first and fourth insulated gate bipolar transistors;

wherein said lifetime control comprises irradiating said first and fourth insulated gate bipolar transistors located close to said d.c. terminals with an electron beam to provide said shorter lifetimes.

4. An inverter device comprising:

a pair of d.c. terminals;

an intermediate node at a potential intermediate between the potentials of said pair of d.c. terminals;

a.c. terminals equal in number to the number of phases of the inverter device;

a plurality of arms each connected between one of said d.c. terminals and one of said a.c. terminals, comprising two parallel circuits connected in series, each parallel circuit including a switching device and a diode opposite in polarity to said switching device; and a plurality of diodes each connected between said intermediate node and a node between the parallel circuits of a corresponding one of the arms, wherein a lifetime control is applied to said switching devices located close to said d.c. terminals so that lifetimes of said switching devices located close to said d.c. terminals are shorter than lifetimes of said switching devices located close to said a.c. terminals to decrease switching losses and decrease switching times of said switching devices located close to said d.c. terminals;

wherein said lifetime control comprises irradiating said switching devices located close to said d.c. terminals with an electron beam to provide said shorter lifetimes.

5. An inverter device comprising:

a pair of d.c. terminals;

an intermediate node at a potential intermediate between the potentials of said pair of d.c. terminals;

a.c. terminals equal in number of the number of phases;

a plurality of arms each connected between one of said d.c. terminals and one of said a.c. terminals, comprising two parallel circuits connected in series, each parallel circuit including a switching device and a diode opposite in polarity to said switching device; and a plurality of diodes each connected between the intermediate node and a node between the parallel circuits of a corresponding one of the arms, wherein a lifetime control is applied to said diodes of said parallel circuits located close to said d.c. terminals so that lifetimes of said diodes of said parallel circuits located close to said d.c. terminals are shorter than lifetimes of said diodes of said parallel circuits located close to said a.c. terminals to decrease switching losses and decrease switching times of said diodes of said parallel circuits located close to said d.c. terminals;

wherein said lifetime control comprises irradiating said diodes located close to said d.c. terminals with an electron beam to provide said shorter lifetimes.

* * * * *

UNITED STATES PATENT AND TRADEMARK OFFICE
CERTIFICATE OF CORRECTION

PATENT NO.   : 5,459,655
DATED        : October 17, 1995
INVENTOR(S)  : M. MORI et al.

It is certified that error appears in the above-indentified patent and that said Letters Patent is hereby corrected as shown below:

The Title page item [63], should indicate the following:

Related U.S. Application Data

-- Continuation-in-part of Serial No. 07/631,289, filed December 20, 1990 and now U.S. Patent 5,274,541 issued December 28, 1993 and a continuation-in-part of Serial No. 07/971,567, filed November 5, 1992 and now U.S. Patent 5,278,443 issued January 11, 1994, which was a continuation of Serial No. 07/833,706, filed February 11, 1992 and now U.S. Patent 5,166,760 issued November 24, 1992, which was a continuation of Serial No. 07/660,872, filed February 26, 1991 and now U.S. Patent 5,101,244 issued March 31, 1992. --

Signed and Sealed this

First Day of July, 1997

Attest:

*Attesting Officer*

BRUCE LEHMAN
*Commissioner of Patents and Trademarks*

UNITED STATES PATENT AND TRADEMARK OFFICE
CERTIFICATE OF CORRECTION

PATENT NO. : 5,459,655
DATED : October 17, 1995
INVENTOR(S) : M. MORI et al.

It is certified that error appears in the above-indentified patent and that said Letters Patent is hereby corrected as shown below:

On the title page: Item [30] Foreign Application Priority Data:
should read --

```
Dec. 22, 1989 [JP] Japan ------------ 1-331334
Feb. 28, 1990 [JP] Japan ------------ 2-045434 --
```

Signed and Sealed this

Twenty-first Day of July, 1998

Attest:

BRUCE LEHMAN

Attesting Officer

Commissioner of Patents and Trademarks